(12) United States Patent
Ukita et al.

(10) Patent No.: US 6,268,246 B1
(45) Date of Patent: Jul. 31, 2001

(54) METHOD FOR FABRICATING A MEMORY CELL

(75) Inventors: Shigenari Ukita, Thuchiura (JP); Takayuki Niuya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/399,842

(22) Filed: Sep. 21, 1999

Related U.S. Application Data

(60) Provisional application No. 60/101,383, filed on Sep. 21, 1998.

(51) Int. Cl.[7] ............................................. H01L 21/8242
(52) U.S. Cl. .......................... 438/253; 438/438; 438/675
(58) Field of Search ................................ 438/253–256, 438/393–399, 675

(56) References Cited

U.S. PATENT DOCUMENTS

| | | | |
|---|---|---|---|
| 5,706,164 | * 1/1998 | Jeng | 438/142 |
| 5,780,339 | * 7/1998 | Liu et al. | 438/253 |
| 5,789,289 | * 8/1998 | Jeng | 438/253 |
| 6,033,966 | * 3/2000 | Linliu | 438/396 |
| 6,080,620 | * 6/2000 | Jeng | 438/253 |

* cited by examiner

Primary Examiner—Jey Tsai
(74) Attorney, Agent, or Firm—Carlton H. Hoel; W. James Brady; Frederick J. Telecky, Jr.

(57) ABSTRACT

A method for fabricating a memory cell includes forming a first access line (16) for a storage node (140, 210) and forming a second access line (82) operable to access the storage node (140, 210) in connection with the first access line (16). The first access line (16) includes a first terminal (32) and a second terminal (34). The second access line (82) includes a conductive layer (70) connected to the first terminal (32) of the first access line (16). An opening (88) is formed in the second access line (82) for connection of the storage node (140, 210) to the second terminal (34) of the first access line (16). A sidewall (92) is formed in the opening (88) to form a contact hole (94) insulated from the conductor (70) of the second access line (82). The storage node (140, 210) is formed having a self-aligned contact (102) formed in the contact hole (94) and connected to the second terminal (34) of the first access line (16).

2 Claims, 9 Drawing Sheets

METHOD FOR FABRICATING A MEMORY CELL

This appln claim benefit of Provisional No. 60/101,383 filed Sep. 21, 1998.

TECHNICAL FIELD OF THE INVENTION

This invention relates generally to electronic devices, and more particularly to an improved method for fabricating a memory cell.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors, and other semiconductor devices. Typically, such devices are fabricated on a substrate and interconnected to form memory arrays, logic structures, timers and other integrated circuits. One type of memory array is a dynamic random access memory (DRAM) in which memory cells retain information only temporarily and are refreshed at periodic intervals. Despite this limitation, DRAMs are widely used because they provide low cost per bit of memory, high device density, and feasibility of use.

In a DRAM, each memory cell typically includes an access transistor coupled to a storage capacitor. In order to fabricate high density DRAMs, the storage capacitors must take up less planar area in the memory cells. As storage capacitors are scaled down in dimensions, a sufficiently high storage capacity must be maintained. Efforts to maintain storage capacity have concentrated on building three-dimensional capacitor structures that increase the capacitor surface area. The increased surface area provides for increased storage capacity. Three-dimensional capacitor structures include trench capacitors and stacked capacitors.

For stacked capacitors, the storage node generally extends significantly above the surface of an underlying substrate in order to provide a large surface area and thus sufficient storage capacity. This leads to topological problems in the formation of subsequent layers in the DRAM. Such topological problems are reduced by the use of crown-type stacked capacitors that increase surface area of the storage node while minimizing height. Crown-type capacitors, however, have a high process complexity which leads to high fabrication cost and low yield.

SUMMARY OF THE INVENTION

In accordance with the present invention, an improved method for fabricating a memory cell is provided that substantially eliminates or reduces disadvantages and problems associated with previously developed systems and methods. In particular, the present invention provides a simplified method for fabricating a storage node for a memory cell that greatly reduces fabrication steps and cost.

In one embodiment of the present invention, a method for fabricating a memory cell includes forming a first access line for a storage node and forming a second access line operable to access the storage node in connection with the first access line. The first access line includes a first terminal and a second terminal. The second access line includes a conductive layer connected to the first terminal of the first access line. An opening is formed in the second access line for connection of the storage node to the second terminal of the first access line. A sidewall is formed in the opening to form a contact hole insulated from the conductor of the second access line. The storage node is formed having a self-aligned contact formed in the contact hole and connected to the second terminal of the first access line.

Technical advantages of the present invention include providing an improved method for fabricating a memory cell. In particular, the storage node for the memory cell includes a self-aligned contact that eliminates storage node contact patterning and etching processes. In addition, a first electrode for the storage node is entirely formed from a single conductive layer. As a result, conventional deposition, anneal and etch-back processes associated with electrode fabrication are eliminated. The simplified processes reduce complexity of the memory cell and thus reduce fabrication cost while increasing yield.

BRIEF DESCRIPTION OF THE DRAWINGS

For a more complete understanding of the present invention and its advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 and 2 of the drawings, in which like numerals refer to like parts throughout the several views.

FIGS. 1A–M are a series of schematic cross-sectional diagrams illustrating fabrication of a storage node for a memory cell in accordance with one embodiment of the present invention. In this embodiment, the memory cell is a dynamic random access memory (DRAM) cell. The storage node, memory cell, and method of the present invention may be used in connection with other suitable types of memory cells, memory arrays, and electronic circuits.

Figure 1A:
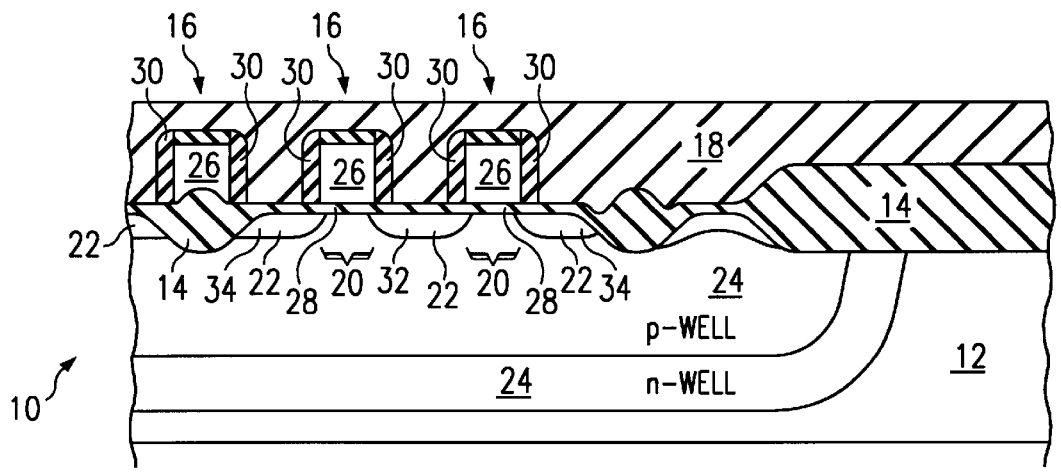
FIGS. 1A–M are a series of schematic cross-sectional diagrams illustrating fabrication of a storage node for a memory cell in accordance with one embodiment of the present invention.

Referring to FIG. 1A, an initial DRAM structure 10 includes a substrate 12, isolation structures 14, a first set of access lines 16, and a planarizing layer 18. The DRAM structure may also include periphery devices and circuits for accessing or otherwise operating in connection with the DRAM.

The substrate 12 may be a wafer, an epitaxial or other layer formed on a wafer or other underlying structure, a semiconductor on insulator (SOI) system and the like. The substrate includes semiconductive material conventionally doped and isolated by the isolation structure 14 to form channels 20, terminals 22, wells 24, and other elements of the DRAM. The semiconductive material comprises single-crystalline silicon or other suitable material.

The isolation structures 14 may be local oxidation on silicon (LOCOS) structures conventionally formed by growing a thin pad oxide over the semiconductor layer 12 and depositing a thin nitride layer over the pad oxide. Photoresist is spun on and lithographically patterned to define field regions in which the LOCOS structures are to be formed. The thin nitride layer is etched in the field regions with the patterned photoresist as an etch mask. The patterned photoresist is stripped and the LOCOS structures grown in the field regions with the patterned nitride acting as an oxidation barrier. After formation of the LOCOS structures, the nitride mask and remaining pad oxide are conventionally removed to leave the isolation structures 14.

The access lines 16 may be word lines, bit lines, transistors or other suitable devices used directly or indirectly to selectively access the memory cells. For the exemplary DRAM embodiment, the access lines 16 are word lines. The word lines 16 each include a gate electrode 26, a gate dielectric 28, sidewalls 30, a first terminal 32, and a second terminal 34. As used herein, the term "each" means each of at least a subset of the specified elements. The first and second terminals 32 and 34 may be a source, drain, or other suitable type of electrode or other element for one or more of the word lines 16.

The planarizing layer 18 is conventionally formed outwardly from the substrate 12 and the word lines 16. As described in more detail below, the planarizing layer 18 provides a base on which a second set of access lines and storage nodes are fabricated for the memory cells. The planarizing layer 18 comprises a suitable dielectric material that can be deposited and planarized over and between the word lines 16. Planarization is accomplished by chemical-mechanical polishing, reflow, or other suitable technique. For the exemplary DRAM embodiment, the planarizing layer 18 comprises boron phosphate silicate glass (BPSG) that is conventionally deposited and planarized by reflow techniques.

Figure 1B:
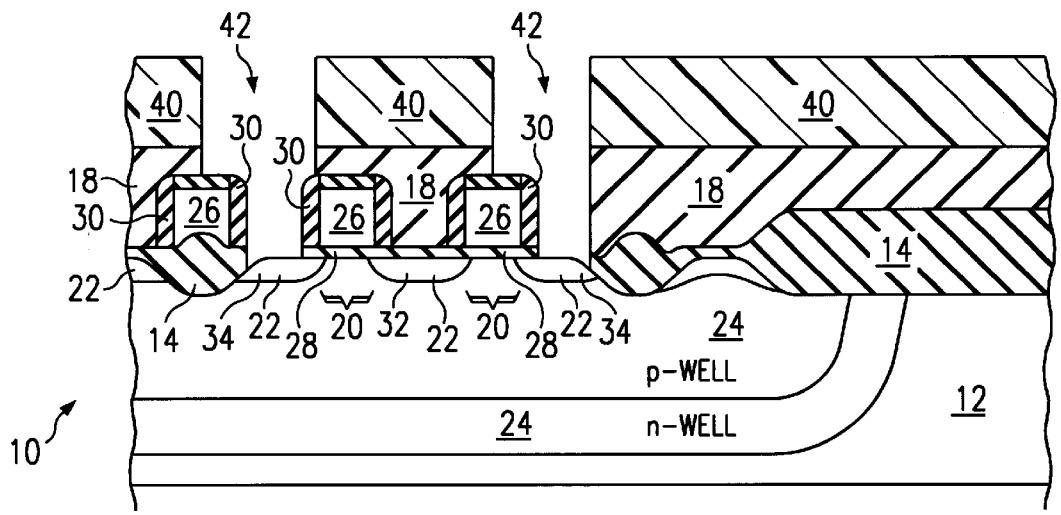

Referring to FIG. 1B, a photolithographic mask 40 is conventionally formed outwardly from the planarizing layer 18. The mask 40 is patterned to form plug holes 42 in the planarizing layer 18 and isolation structures 14. As described in more detail below, plugs are formed in the plug holes 42. The plugs each connect the second terminal 34 of the word lines 16 with a later formed storage node. As used herein, the term "connected" means joined, coupled, linked or otherwise in electrical communication.

Portions of the planarizing layer 18 and the isolation structures 14 exposed by the mask 40 are etched through the mask 40 to form the plug holes 42. The plug holes 42 expose the second terminals 34 of the word lines 16. The etch is a conventional anisotropic etch, other suitable etch, or other suitable series of etches capable of selectively removing the exposed material of the planarizing layer 18 and isolation structures 14 from the second terminals 34. After the etch process, the mask 40 is conventionally removed from the planarizing layer 18.

Figure 1C:
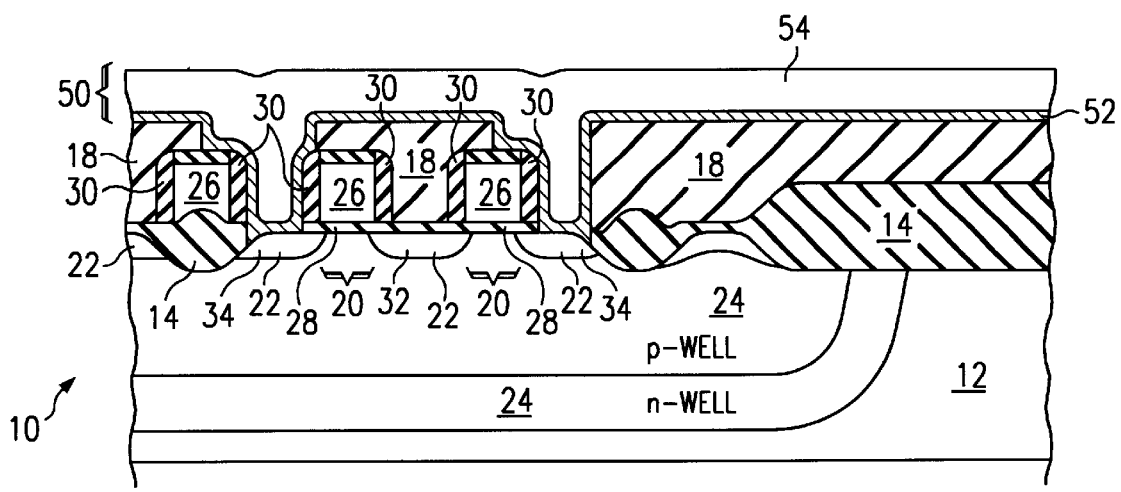

Referring to FIG. 1C, a plug layer 50 is formed outwardly from the planarizing layer 18 and in the plug holes 42. The plug layer 50 comprises a conductive material capable of connecting the second terminal 34 with the later formed storage node. For the exemplary DRAM embodiment, the plug layer 50 comprises an underlying doped polysilicon sublayer 52 conventionally deposited to a thickness of about 500 angstroms and an overlying non-doped polysilicon sublayer 54 conventionally deposited to a thickness of about 5,000 angstroms.

Figure 1D:
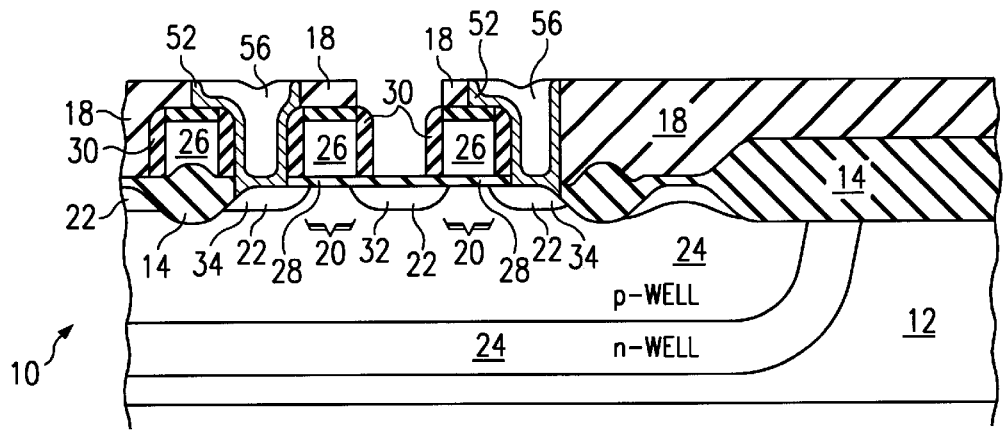

Referring to FIG. 1D, the plug layer 50 is etched back to form plugs 56. Each plug 56 will connect the second terminal 34 of a word line 16 with the later formed storage nodes. The etch is a conventional isotropic etch, other suitable etch, or other suitable series of etches capable of selectively removing an excess portion of the plug layer 50 from the planarizing layer 18.

Figure 1E:
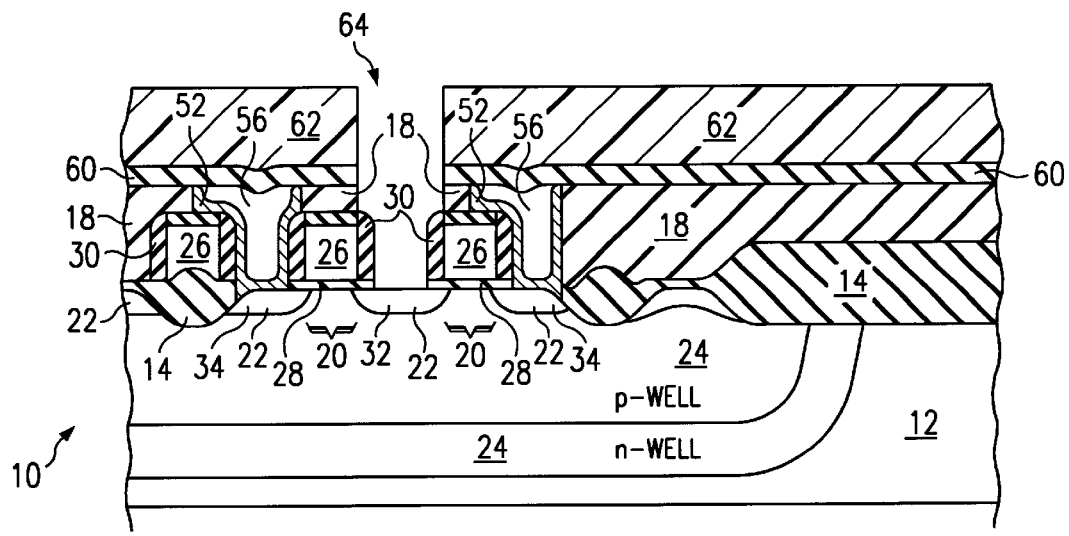

Referring to FIG. 1E, a plug insulation layer 60 is formed outwardly from the planarizing layer 18 and the plugs 56. The plug insulation layer 60 insulates the plugs 56 from the later formed second set of access lines. The plug insulation layer 60 comprises a dielectric material capable of insulating the plugs 56. For the exemplary DRAM embodiment, the plug insulation layer 60 comprises tetraethylorthosilicate (TEOS) conventionally deposited to a thickness of about 500 angstroms.

A photolithographic mask 62 is conventionally formed outwardly from the plug insulation layer 60. The mask 62 is patterned to form contact holes 64 in the plug insulation layer 60, the planarizing layer 18, and the isolation structures 14. As described in more detail below, contacts for the second set of access lines are formed in the contact holes 64. These contacts each connect the first terminal 32 for each memory cell with a later formed second access line.

Portions of the plug insulation layer 60, the planarizing layer 18, and the isolation structures 14 exposed by the mask 62 are etched through the mask 62 to form the contact holes 64. The contact holes 64 expose the first terminals 32 of the word lines 16. The etch is a conventional anisotropic etch, other suitable etch, or other suitable series of etches capable of selectively removing the exposed material of the plug insulation layer 60, the planarizing layer 18, and the isolation structures 14 from the first terminals 32. After the etch process, the mask 62 is conventionally removed from the plug isolation layer 60.

Figure 1F:
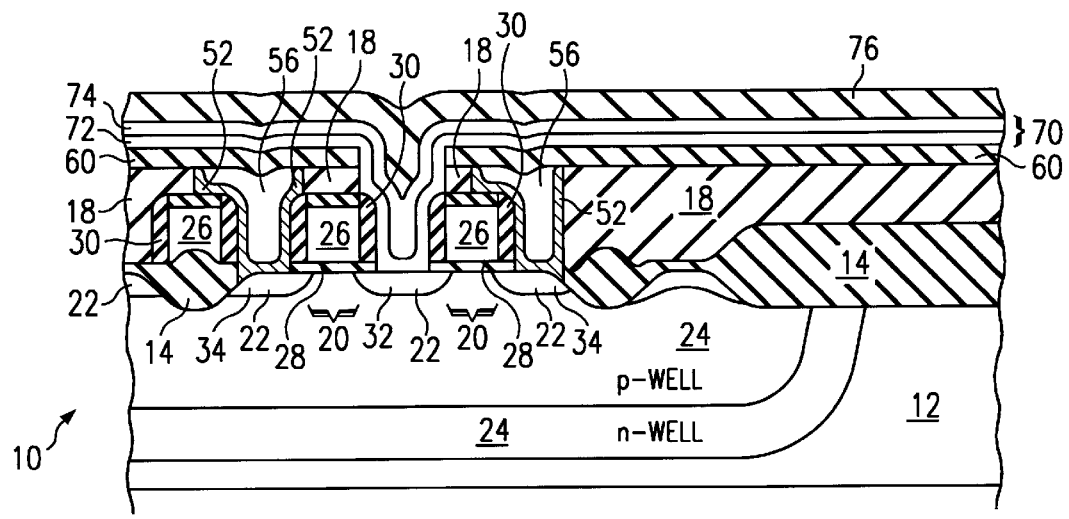

Referring to FIG. 1F, a conductive layer 70 is formed outwardly from the plug insulation layer 60 and in the contact holes 64. As described in more detail below, the second set of access lines is formed from the conductive layer 70. For the exemplary DRAM embodiment, the conductive layer 70 comprises an underlying polysilicon sublayer 72 conventionally deposited to a thickness of about 700 angstroms and an overlying tungsten silicide sublayer 74 conventionally deposited to a thickness of about 1,200 angstroms.

An insulative cap layer 76 is formed outwardly from the conductive layer 70. As described in more detail below, an insulative cap is formed from the insulative cap layer 76 for each second access line. Each insulative cap insulates a second access line from the later formed storage node. For the exemplary DRAM embodiment, the insulative cap layer 76 comprises TEOS deposited to a thickness of about 2,000 angstroms.

Figure 1G:
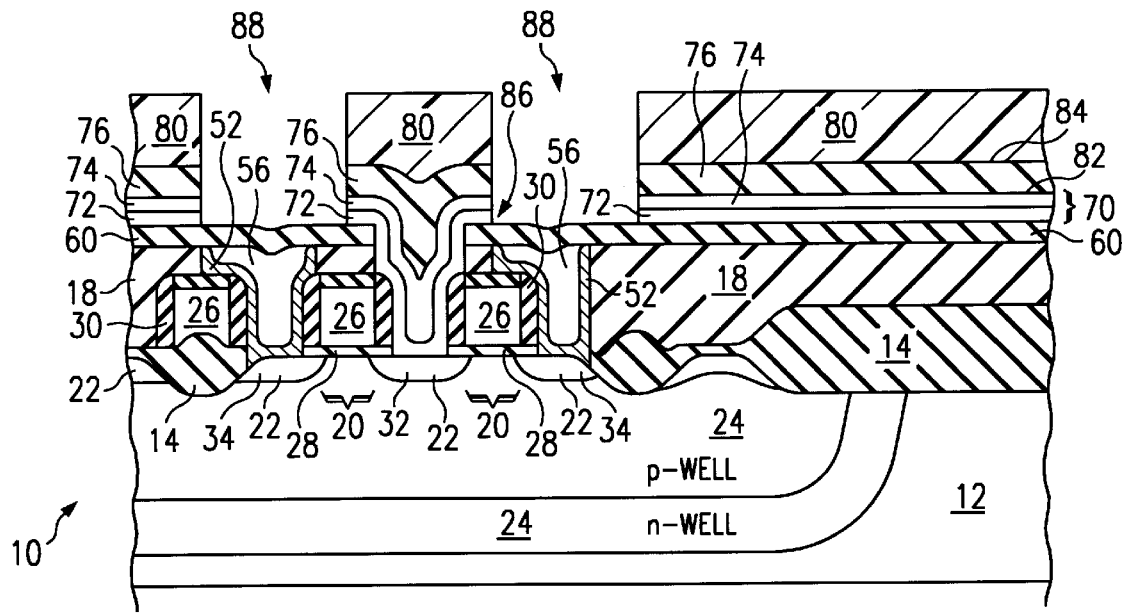

Referring to FIG. 1G, a photolithographic mask 80 is conventionally formed outwardly from the insulative cap layer 76. The mask 80 is patterned to form the second set of access lines 82 from the conductive layer 70 and the insulative caps 84 for the second access lines 82 from the insulative cap layer 76. The second access lines 82 may be bit lines, word lines, transistors, or other suitable devices used directly or indirectly to selectively access the memory cells in connection with the first set of access lines 16. For the exemplary DRAM embodiment, the second access lines 82 are bit lines disposed perpendicular to the word lines 16.

The bit lines 82 include a bit line contact 86 formed in each contact hole 64 for each memory cell and an opening 88 for a later formed storage node contact for each memory cell. The bit line contacts 86 connect the bit lines 82 with the first terminals 32 of the word line 16. The openings 88 are disposed over the plugs 56 and extend through the insulative cap 84, which matches the configuration of the bit lines 82.

Portions of the insulative cap layer 76 and conductive layer 70 exposed by the mask 80 are etched through the mask 80 to form the bit lines 82 and the insulative cap 84. The etch is a conventional anisotropic etch, other suitable etch, or other suitable series of etches capable of selectively removing the exposed material of the insulative cap layer 76 and the conductive layer 70 from the plug insulation layer 60. After the etch process, the mask 80 is conventionally removed from the insulative cap 84.

Figure 1H:
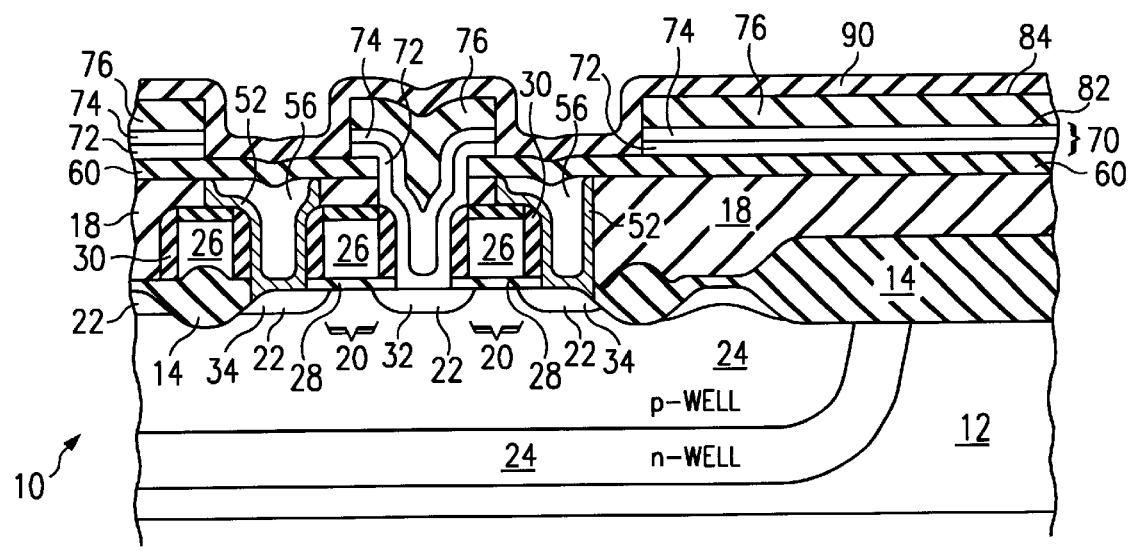

Referring to FIG. 1H, a sidewall insulative layer 90 is formed outwardly from the insulative cap 84 and in the openings 88. For the exemplary DRAM embodiment, the sidewall insulative layer 90 comprises TEOS conventionally deposited to a thickness of about 1,000 angstroms.

Figure 1I:
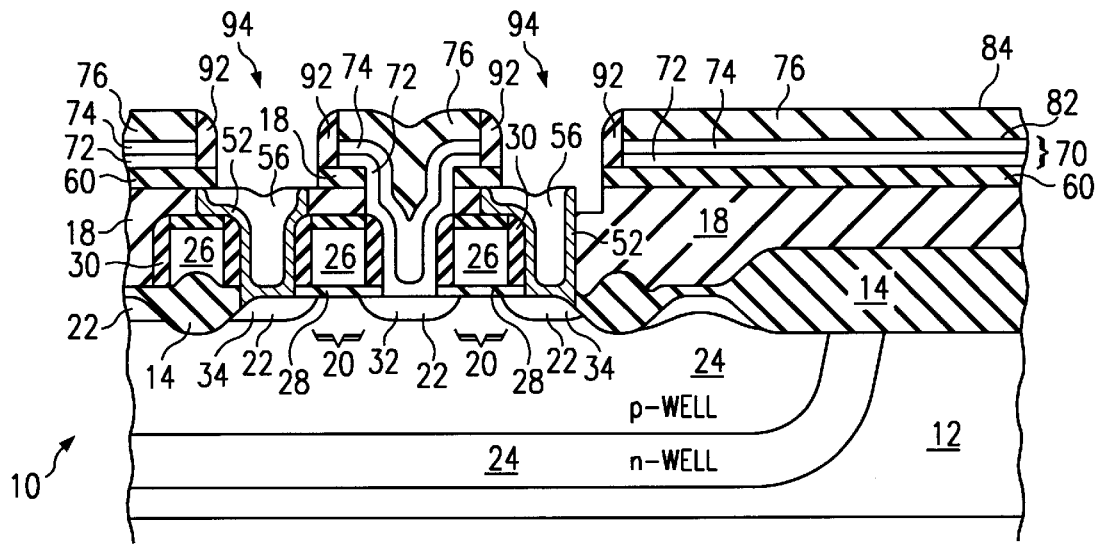

Referring to FIG. 1I, the sidewall insulative layer 90 is etched back to form sidewalls 92 in the openings 88 and expose the plug 56. The sidewalls 92 define a contact hole 94 through the bit line 82 for the storage node. The contact hole 94 is insulated from the bit line 82 by the sidewall 94.

During the etch back process, the insulative cap 84 is protected by the overlying material of the sidewall insulative layer 90, which is removed by the etch. Portions of the plug isolation layer 60 overlying the plugs 56 are also removed. Accordingly, the bit line 82 is fully insulated from the later formed storage nodes while the plugs 56 are exposed for connection to the storage nodes. For the exemplary DRAM embodiment, the etch back process is a conventional anisotropic etch, other suitable etch, or other suitable series of etches. The etch is preferably highly selective to nitride to minimize damage to nitride sidewalls 30 of the word lines 16 and other gate structures of the DRAM.

Figure 1J:
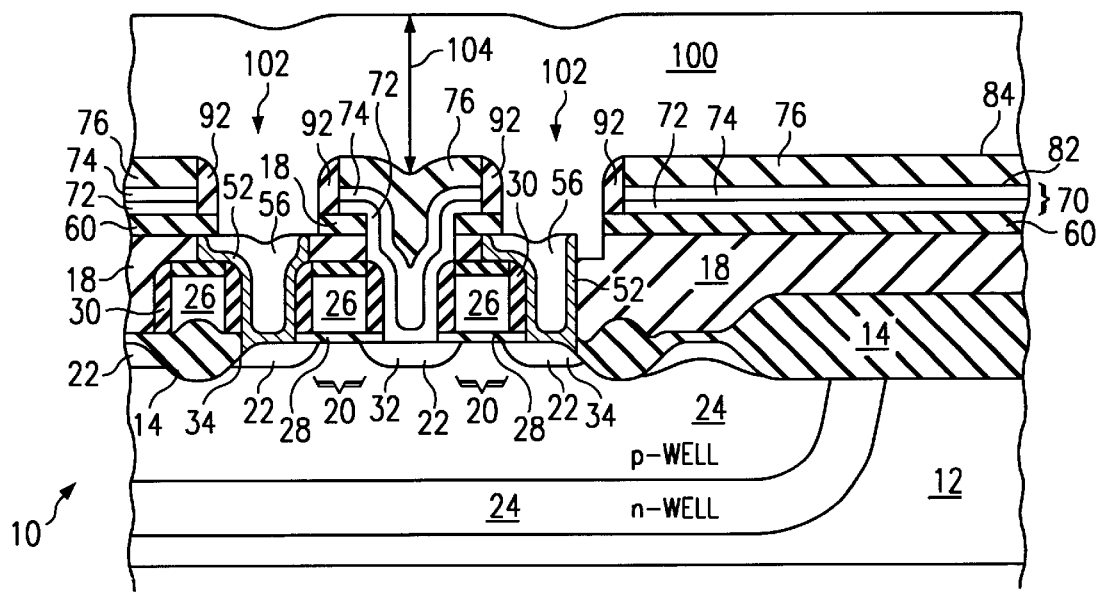

Referring to FIG. 1J, a conductive layer 100 is formed outwardly from the insulative cap 84 and in the contact holes 94. As described in more detail below, a self-aligned storage node contact 102 and a first storage node electrode are formed from the conductive layer 100. The storage node contact 102 is formed in the contact hole 94 and self-aligned in that it is formed during deposition of the conductive layer 100 into the contact hole 94 without need of an additional mask process to form the contact hole 94. Accordingly, fabrication steps and cost are reduced. The first electrode is formed entirely from the conductive layer 100. Accordingly, the conductive layer 100 preferably has a thickness greater than or equal to about 2,500 angstroms. For the exemplary DRAM embodiment, the conductive layer 100 comprises polysilicon conventionally deposited to a thickness 104 of about 7,000 angstroms to give the resulting storage node a high capacitance. The thickness 104 of the conductive layer 100 may be suitably varied in accordance with the capacitance requirements and configuration of the storage node.

Figure 1K:
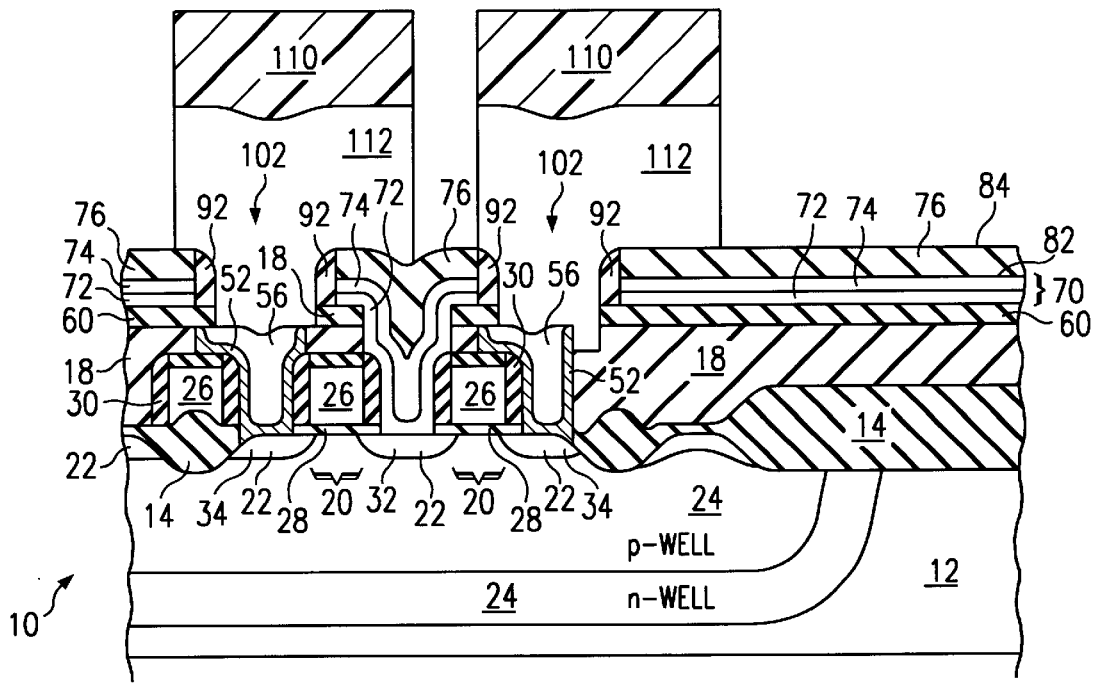

Referring to FIG. 1K, a photolithographic mask 110 is conventionally formed outwardly from the conductive layer 100. The mask 110 is patterned to form a first, or bottom, electrode 112 for each of the memory cells. The first electrode 112 is isolated from the bit line 82 by the insulative cap 84 and the sidewalls 92. For the exemplary DRAM embodiment, the first electrode 112 is a substantially block-shaped electrode without internal cavities.

Portions of the first conductive layer 100 exposed by the mask 110 are etched through the mask 110 to form the first electrodes 112. The etch is a conventional anisotropic etch, other suitable etch, or other suitable series of etches capable of selectively removing the exposed material of the conductive layer 100 from the insulative cap 84. After the etch process, the mask 110 is conventionally removed from the insulative cap 84.

Figure 1L:
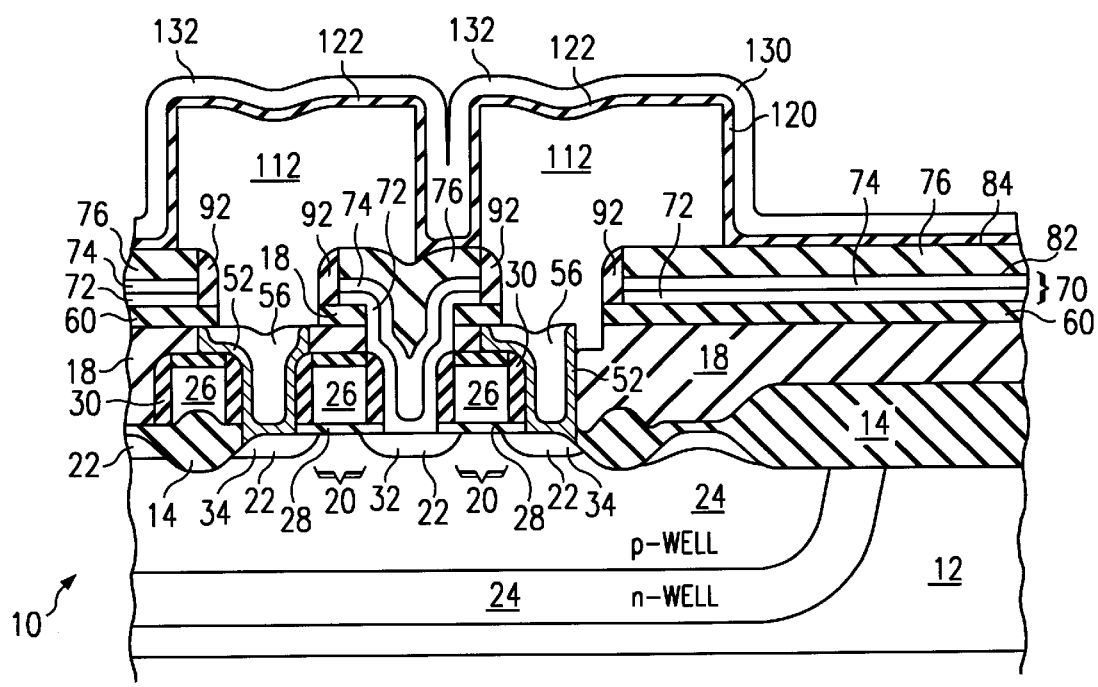

Referring to FIG. 1L, a dielectric layer 120 is formed outwardly from the first electrode 112. The dielectric layer 120 forms a capacitor dielectric 122 for the storage node. For the exemplary DRAM embodiment, the dielectric layer 120 comprises an underlying oxide sublayer conventionally deposited to a thickness of about 20 angstroms and an overlying nitride sublayer conventionally deposited to a thickness of about 60 angstroms.

A second conductive layer 130 is formed outwardly from the dielectric layer 120. The second conductive layer 130 forms a second, or upper electrode 132 for the storage node. For the exemplary DRAM embodiment, the second conductive layer 130 comprises polysilicon conventionally deposited to a thickness of about 1,000 angstroms.

Figure 1M:
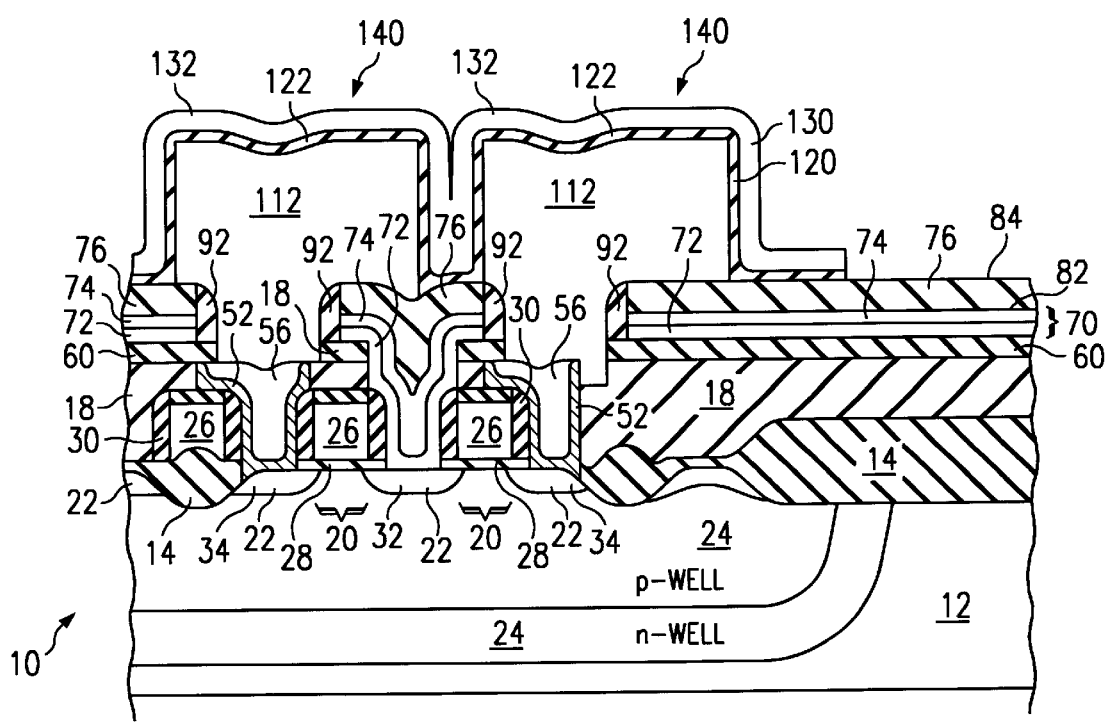

Referring to FIG. 1M, an excess portion of the dielectric layer 120 and second conductive layer 130 not forming the capacitor dielectric 122 or second electrode 132 is removed. This excess portion may be removed by a suitable anisotropic etch, isotropic etch, or series of etches. The etch is preferably highly selective to nitride to minimize damage to nitride gate structures of the DRAM.

The first and second electrodes 112 and 132, together with the capacitor dielectric 122, form a storage node 140 for the memory cell. For the exemplary DRAM embodiment, the storage node is a stacked capacitor. The height of the stacked capacitor provides a large surface area between the electrodes and thus a suitable capacitance for the memory cell.

FIGS. 2A–F are a series of schematic cross-sectional diagrams illustrating fabrication of a storage node for a memory cell in accordance with another embodiment of the present invention. In FIGS. 2A–G, reference numerals previously described in connection with FIGS. 1A–M are reused to designate similar elements.

Figure 2A:
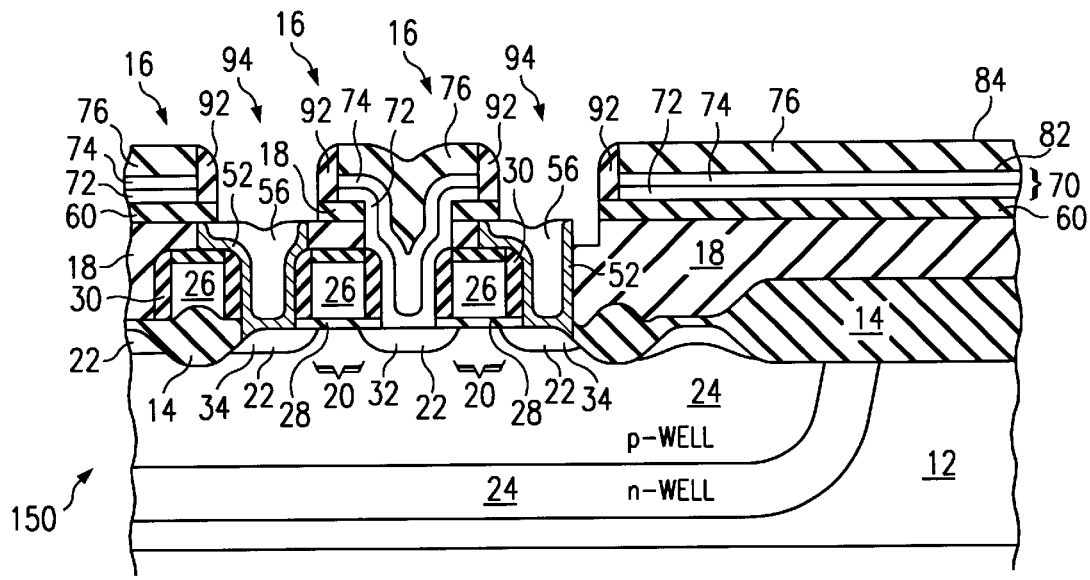
FIGS. 2A–F are a series of schematic cross-sectional diagrams illustrating fabrication of a storage node for a memory cell in accordance with another embodiment of the present invention.

Referring to FIG. 2A, an initial DRAM structure 150 includes the substrate 12, the isolation structures 14, the word lines 16, and the planarizing layer 18 as previously described in connection with FIG. 1A. The initial structure 150 also includes the plugs 56 connected to the second terminals 34 of the word lines 16 and the bit lines 82 having the bit line contacts 86 connected to the first terminals 32 of the word lines 16. The bit line 82 is covered by the insulative cap 84. The sidewalls 92 are formed in the openings 88 in the bit line 82 to form the contact holes 94 for the later formed storage nodes.

Figure 2B:
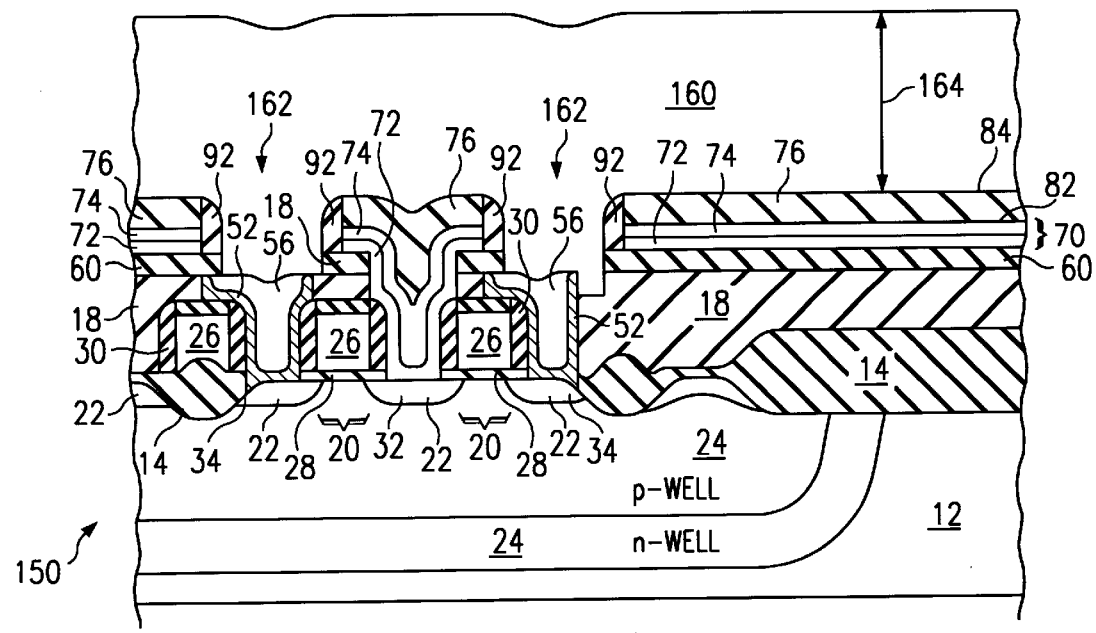

Referring to FIG. 2B, a conductive layer 160 is formed outwardly from the insulative cap 84 and in the contact holes 94. As described in more detail below, a self-aligned storage node contact 162 and a first storage node electrode are formed from the conductive layer 160. The storage node contact 162 is formed in the contact hole 94 and self-aligned in that it is formed during deposition of the conductive layer 100 into the contact hole 94 without need of an additional mask process to form the contact hole 94. Accordingly, fabrication steps and costs are reduced. The first electrode is formed entirely from the conductive layer 160. For the second exemplary DRAM embodiment, the conductive layer 160 comprises polysilicon conventionally deposited to a thickness 164 of about 5,500 angstroms. The thickness 164 of the conductive layer 160 may be suitably varied in accordance with the capacitance requirements and configuration of the storage node.

Figure 2C:
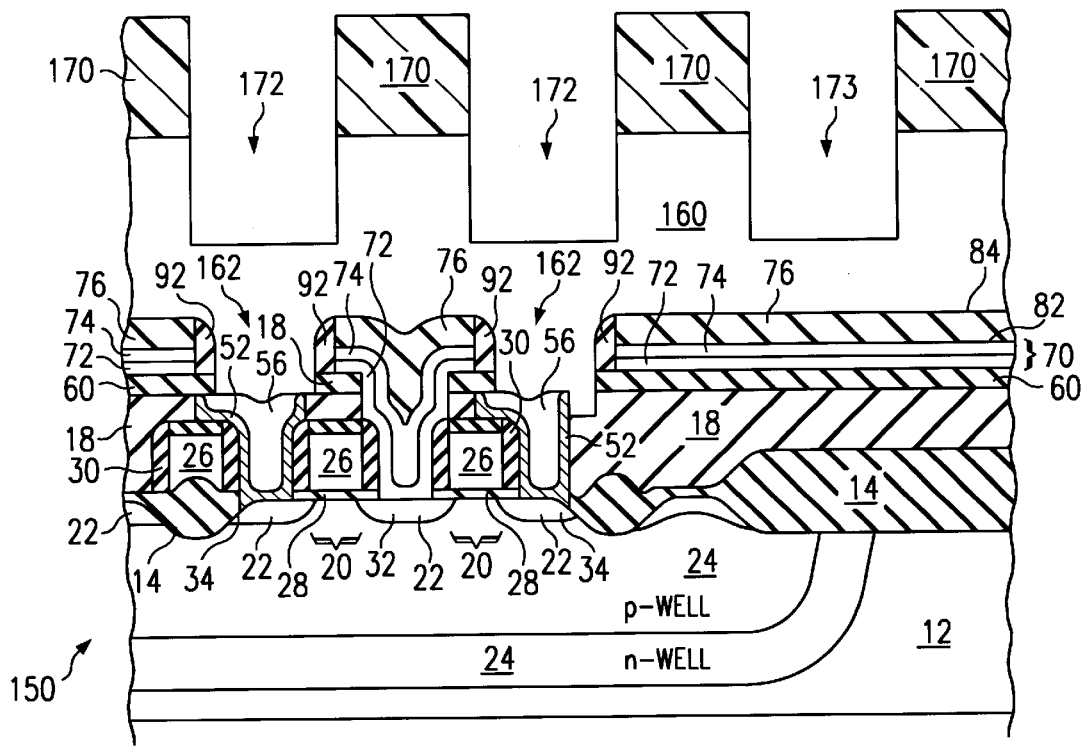

Referring to FIG. 2C, a photolithographic mask 170 is conventionally formed outwardly of the conductive layer 160. The mask 170 is patterned to form internal cavities 172 in the conductive layer 160. As described in more detail below, the internal cavity 172 increases the surface area of the first electrode and thus a capacitance of the storage node.

Portions of the conductive layer 160 exposed by the mask 170 are etched through the mask 170 to form the cavities 172. The etch is a conventional anisotropic etch or other suitable timed etch. After the etch process, the mask 170 is conventionally removed from the conductive layer 160.

Figure 2D:
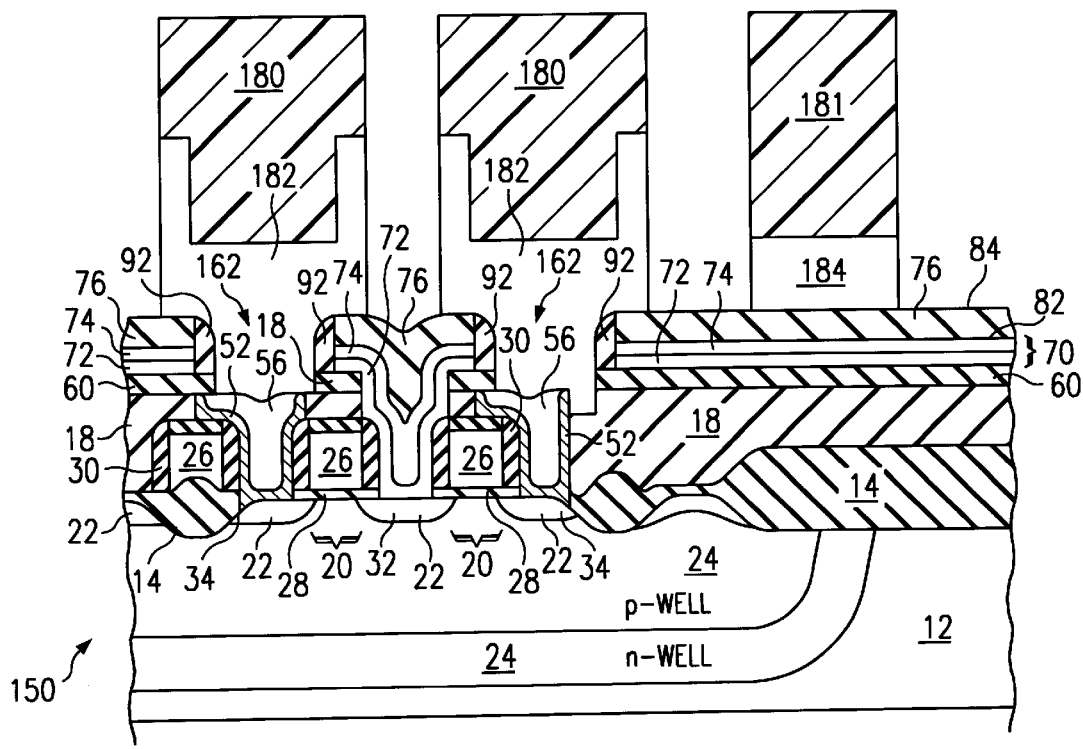

Referring to FIG. 2D, a photolithographic mask 180 is conventionally formed outwardly from the conductive layer 160. The mask 180 is patterned to form a first, or bottom electrode 182 and an intermediate step 184. The mask 180 protects the previously formed cavities 172 and the surrounding portion of the conductive layer 160, which will form sidewalls for the first electrode 182. The first electrode 182 is isolated from the bit line 82 by the insulative cap 84 and the sidewalls 92. For the second exemplary DRAM embodiment, the first electrode 182 is a crown-shaped electrode. As described in more detail below, the intermediate step 184 improves interconnects between the memory array and periphery circuitry.

Portions of the conductive layer 160 exposed by the mask 180 are etched through the mask 180 to form the first electrodes 182 and step 184. The etch is a conventional anisotropic etch, other suitable etch, or other suitable series of etches capable of selectively removing the exposed material of the conductive layer 160 from the insulative cap 84. After the etch process, the mask 180 is conventionally removed from the first electrodes 182 and the step 184.

Figure 2E:
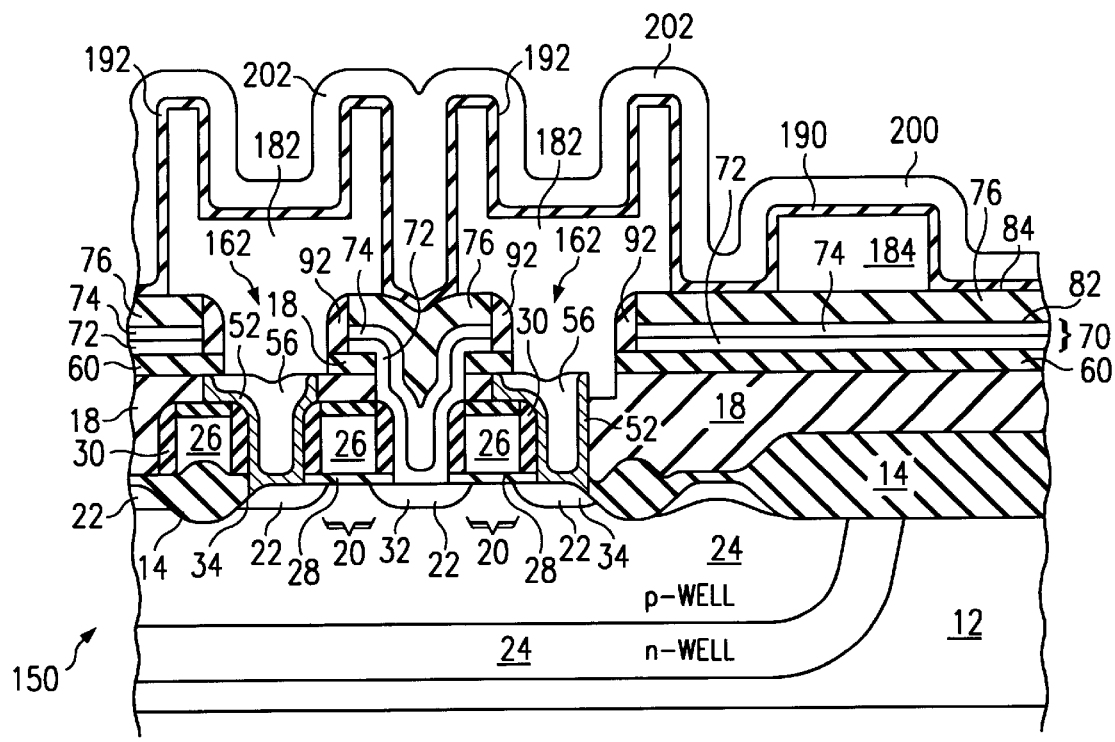

Referring to FIG. 2E, a dielectric layer 190 is formed outwardly from the first electrode 182. The dielectric layer 190 forms a capacitor dielectric 192 for the storage node. For the second exemplary DRAM embodiment, the dielectric layer 190 comprises an underlying oxide sublayer conventionally deposited to a thickness of about 20 angstroms and an overlying nitride sublayer conventionally deposited to a thickness of about 60 angstroms.

A second conductive layer 200 is formed outwardly from the dielectric layer 190. The second conductive layer 200 forms a second, or upper electrode 202 for the storage node. For the second exemplary DRAM embodiment, the second conductive layer 200 comprises polysilicon conventionally deposited to a thickness of about 1,000 angstroms.

Figure 2F:
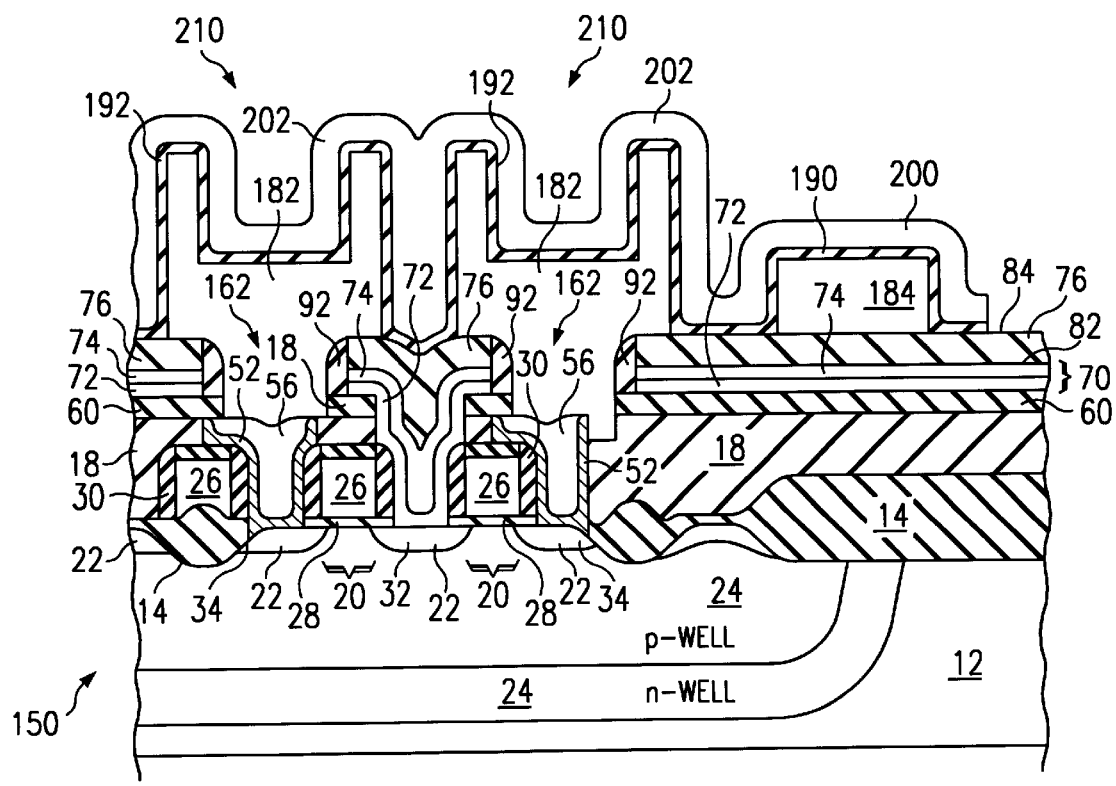

Referring to FIG. 2F, an excess portion of the dielectric layer 190 and second conductive layer 200 are removed by a conventional mask process or other suitable process. The first and second electrodes 182 and 202, together with the capacitor dielectric 192, form a storage node 210 for the memory cell. For the second exemplary DRAM embodiment, the storage node is a stacked capacitor. The stacked capacitor has a crown-type configuration to provide a large surface area between the electrodes and thus a suitable capacitance for the memory cell.

The intermediate step 184 is formed by making the pattern 173 in FIG. 2C larger than the pattern mask 181 in FIG. 2D at the edge of the array. The intermediate step 184 is formed at the edge of the memory array and has a height between that of the storage nodes 182 and the adjacent circuitry. Accordingly, the intermediate step 184 reduces the slope between the memory array and the adjacent circuitry and thus improves interconnects between the memory array and periphery circuitry.

Although the present invention has been described with several embodiments, various changes and modifications may be suggested to one skilled in the art. It is intended that the present invention encompass such changes and modifications as fall within the scope of the appended claims.

What is claimed is:

1. A method for fabricating a memory cell, comprising:

forming a first access line for a storage node, the first access line including a first terminal and a second terminal;

forming a first dielectric layer over the first access line and first and second terminals;

forming a conductive plug through the first dielectric layer and contacting the second terminal;

forming a second dielectric layer on the first dielectric layer and plug;

forming an opening through the first and second dielectric layers to the first terminal;

forming a second access line on the second dielectric layer plus filling the opening;

forming a third dielectric layer on the second access line and second dielectric layer;

forming a second opening through the second and third dielectric layers to the plug;

forming a conductive layer on the third dielectric plus filling the second opening to contact the plug;

patterning the conductive layer to form the bottom electrode of a capacitor; and forming a capacitor dielectric plus top electrode on the bottom electrode.

2. The method of claim 1, wherein:

the forming a second opening includes forming a sidewall dielectric on the second opening.

* * * * *